United States Patent
Ieong et al.

(10) Patent No.: US 6,677,646 B2
(45) Date of Patent: Jan. 13, 2004

(54) METHOD AND STRUCTURE OF A DISPOSABLE REVERSED SPACER PROCESS FOR HIGH PERFORMANCE RECESSED CHANNEL CMOS

(75) Inventors: Meikei Ieong, Wappingers Falls, NY (US); Omer H. Dokumaci, Wappingers Falls, NY (US); Thomas S. Kanarsky, Hopewell Junction, NY (US); Victor Ku, Tarrytown, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/117,959

(22) Filed: Apr. 5, 2002

(65) Prior Publication Data

US 2003/0189228 A1 Oct. 9, 2003

(51) Int. Cl.[7] .................. H01L 27/01; H01L 27/12; H01L 31/0392
(52) U.S. Cl. .................. 257/347; 257/300; 257/344
(58) Field of Search ................. 257/288, 347, 257/330, 333, 332, 240, 241, 243, 344; 438/149, 151, 154, 161, 300, 301, 302, 289, 217

(56) References Cited

U.S. PATENT DOCUMENTS

| | | | |
|---|---|---|---|
| 5,300,447 A | * | 4/1994 | Anderson .................. 438/282 |
| 5,468,665 A | | 11/1995 | Lee et al. |
| 5,472,897 A | * | 12/1995 | Hsu et al. .................. 438/291 |
| 6,010,921 A | * | 1/2000 | Soutome .................. 438/151 |
| 6,184,097 B1 | | 2/2001 | Yu |
| 6,187,620 B1 | | 2/2001 | Fulford, Jr. et al. |
| 6,225,173 B1 | | 5/2001 | Yu |
| 6,225,229 B1 | | 5/2001 | Huster |
| 6,403,433 B1 | * | 6/2002 | Yu et al. .................. 438/300 |
| 6,429,055 B2 | * | 8/2002 | Oh .................. 438/149 |

FOREIGN PATENT DOCUMENTS

WO    WO 01/39273 A1    5/2001

* cited by examiner

*Primary Examiner*—Phat X. Cao
*Assistant Examiner*—Theresa T. Doan
(74) *Attorney, Agent, or Firm*—Scully, Scott, Murphy & Presser; Joseph P. Abate, Esq.

(57) ABSTRACT

A high-performance recessed channel CMOS device including an SOI layer having a recessed channel region and adjoining extension implant regions and optional halo implant regions; and at least one gate region present atop the SOI layer and a method for fabricating the same are provided. The adjoining extension and optional halo implant regions have an abrupt lateral profile and are located beneath said gate region.

9 Claims, 6 Drawing Sheets

METHOD AND STRUCTURE OF A DISPOSABLE REVERSED SPACER PROCESS FOR HIGH PERFORMANCE RECESSED CHANNEL CMOS

FIELD OF THE INVENTION

The present invention relates to complementary metal oxide semiconductor (CMOS) devices, and more particularly to a recessed channel CMOS device that has low series resistance and improved short-channel characteristics. The present invention also relates to a method of fabricating such a recessed channel CMOS device.

BACKGROUND OF THE INVENTION

Over the past twenty-five years or so, the primary challenge of very large scale integration (VLSI) has been the integration of an ever-increasing number of metal oxide semiconductor field effect transistor (MOSFET) devices with high yield and reliability. This was achieved mainly in the prior art by scaling down the MOSFET channel length without excessive short-channel effects. As is known to those skilled in the art, short-channel effects are the decrease of threshold voltage $V_t$ in short-channel devices due to two-dimensional electrostatic charge sharing between the gate and the source/drain diffusion regions.

In recent years, and as channel lengths are being scaled below 0.1 $\mu$m, SOI complementary metal oxide semiconductor (CMOS) technology has received considerable interest in VLSI for its potential low-voltage, low-power, and high-speed advantages in comparison to bulk CMOS devices. As known to those skilled in the art, SOI structures include an insulating layer, i.e., buried oxide region (BOX), that electrically isolates a top Si-containing layer from a bottom Si-containing layer. The top Si-containing, i.e., the SOI layer, serves as the area in which electronic devices such as CMOS devices can be fabricated.

Thin film SOI CMOS devices, such as SOI MOSFETs, in which the top Si-containing layer has a thickness of about 20 nm or less, are of special interest due to improved isolation, reduced parasitic capacitance as well as the reduction of short-channel and floating body effects that can be obtained from such technology. Despite the known advantages with thin film SOI technology, processing challenges exist which substantially hamper the use of thin SOI MOSFETs in semiconductor integrated circuits. For example, prior art processes for fabricating OI MOSFETs have difficulty in forming a thin (20 nm or less) SOI channel region. One prior art technique to obtain very thin SOI channels is to recess the channel while protecting the S/D regions. This prior art technique ensures that the series resistance of the device can be kept small since the S/D regions can be made as thick as desired. However, in existing recessed channel technology, it is difficult to form extension and halo implant regions having abrupt, i.e., sharp, lateral profiles that overlap the gate edges.

In view of the above-mentioned drawbacks with fabricating prior art thin SOI MOSFETs, there exists a need for providing a new and improved method for fabricating recessed channel MOSFETs which have a thin SOI device channel region as well as adjoining extension and halo implant regions havirig abrupt lateral profiles that overlap the edges of the gate region.

SUMMARY OF THE INVENTION

One object of the present invention is to provide a high-performance recessed channel CMOS device.

Another object of the present invention is to provide a recessed channel CMOS device in which the short-channel effects and series resistance have been substantially minimized.

A further object of the present invention is to provide a recessed channel CMOS device in which the external resistance of the device is not substantially degraded.

A yet further object of the present invention is to provide a recessed channel CMOS device in which the extension implant regions adjoining the recessed channel have an abrupt lateral profile. The term "abrupt lateral profile" as used herein for extension implant regions denotes a lateral drop of 1 decade in concentration in 50 Å or less distance for n-extensions and 150 Å or less for p-extensions.

An even further object of the present invention is to provide a recessed channel CMOS device in which the extension implant regions overlap the edges of the gate region.

A still even further object of the present invention is to provide a recessed channel CMOS device in which the halo implant regions have an abrupt lateral profile. For halo implant regions, the term "abrupt lateral profile" denotes a lateral drop of 1 decade in concentration in 700 Å or less distance for n-halos and in 400 Å or less for p-halos.

These and other objects and advantages are achieved in the present invention by utilizing a method wherein disposable, i.e., sacrificial, spacers are present during the fabrication of the recessed channel and the source/drain regions, but are removed just prior to formation of the extension implant regions. This ensures that the extension implant regions as well as the halo implant regions have an abrupt lateral profile that extends beneath the edges of the gate region of the MOSFET device.

Specifically, and in one aspect of the present invention, a recessed channel CMOS device is provided. In accordance with this aspect of the present invention the recessed channel CMOS device comprises:

an SOI layer having a recessed channel region and adjoining extension implant regions; and at least one gate region present atop said SOI layer, wherein said adjoining extension implant regions have an abrupt lateral profile and are located beneath said gate region.

The inventive device may optionally include adjoining halo implant regions that also have an abrupt lateral profile that extends beneath the edges of the gate region.

Another aspect of the present invention relates to a method of fabricating the above-mentioned recessed channel CMOS device. Specifically, the method of the present invention comprises the step of:

providing a patterned oxide layer over an SOI layer, said patterned oxide layer exposing a portion of said SOI layer;

thinning the exposed portion of the SOI layer to form a recessed channel region;

forming a gate dielectric on said recessed channel region;

forming sacrificial nitride spacers on portions of said gate dielectric so as to protect exposed walls of said SOI layer and said oxide layer and forming a gate conductor on other portions of the gate dielectric not containing said sacrificial nitride spacers;

recessing the oxide layer exposing SOI layer abutting the recessed channel region;

forming source/drain diffusion regions in said exposed SOI layer abutting the recessed channel region; and removing the sacrificial nitride spacers and forming extension and optional halo implant regions in said SOI layer such that said extension and optional halo implant regions have an abrupt lateral profile and are located beneath the gate conductor.

After the extension implant regions are formed, the inventive method further includes forming insulator spacers on exposed sidewalls of the gate conductor.

DETAILED DESCRIPTION OF THE INVENTION

Figure 1:
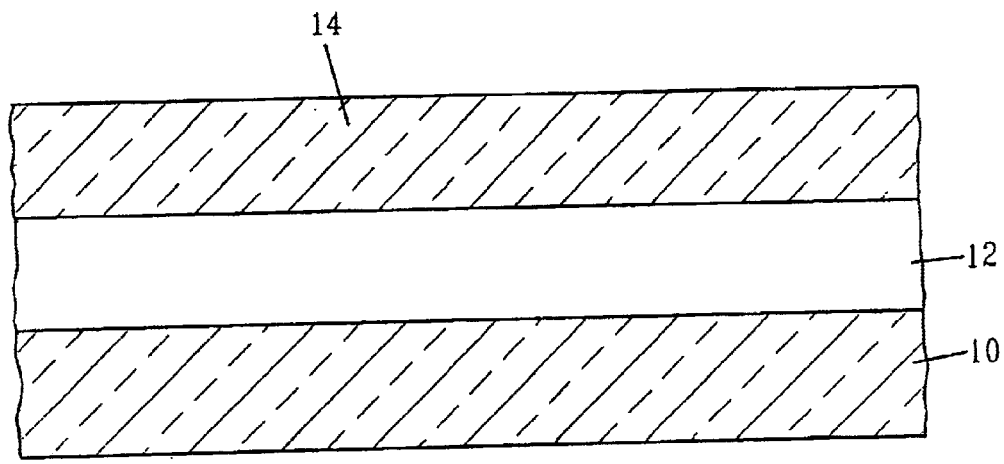
FIGS. 1–12 are pictorial representations illustrating the basic processing steps that are employed in forming the inventive recessed channel CMOS device.

The present invention, which provides a recessed channel CMOS device having minimized series resistance and short-channel effects and a method for fabricating the same, will now be described in greater detail by referring to the drawings that accompany the present application.

FIG. 1 illustrates an initial SOI structure that can be employed in the present invention. Specifically, the SOI structure shown in FIG. 1 comprises bottom Si-containing layer 10, i.e., the Si-containing substrate, insulating layer 12 present atop bottom Si-containing layer 10, and top Si-containing layer 14 present atop the surface of insulating layer 12. The term "Si-containing layer" as used herein denotes a material such as Si, SiGe, SiGeC, SiC and other like Si-containing materials. The insulating layer is typically a buried oxide region.

The SOI structure shown in FIG. 1 is fabricated using techniques well known to those skilled in the art. For example, the SOI structure illustrated in FIG. 1 may be formed by a thermal bonding process, or alternatively, the SOI structure may be formed by an oxygen implantation process which is referred to in the art as a separation by implantation of oxygen (SIMOX) process. In some embodiments, the SOI structure is formed by depositing or thermally growing an insulating layer atop a surface of a Si-containing substrate and thereafter depositing a top Si-containing layer on a surface of the previously deposited insulating layer.

The top Si-containing layer of the SOI structure (hereinafter SOI layer 14) may have a variable initial thickness depending upon the technique used in forming the same. Typically, SOI layer 14 has an initial vertical thickness of from about 10 to about 250 nm, with an initial thickness of from about 25 to about 50 nm being more highly preferred. The thickness of the underlying insulating layer 12 and bottom Si-containing layer 10 is not critical to the present invention.

In some instances, and especially when the SOI layer has an initial thickness of greater than 50 nm, it may be necessary to thin SOI layer 14 from its initial thickness to a predetermined thickness that is about 50 nm or less. This optional thinning step of the present invention is carried out using a technique well known to those skilled in the art. For example, the SOI layer may be thinned by chemical-mechanical polishing (CMP), grinding or a combination of thermal oxidation and etching. When thermal oxidation and etching are employed to thin SOI layer 14, the etching step may be carried out using any conventional dry etching process such as reactive-ion etching, ion beam etching or plasma-etching.

Figure 2:
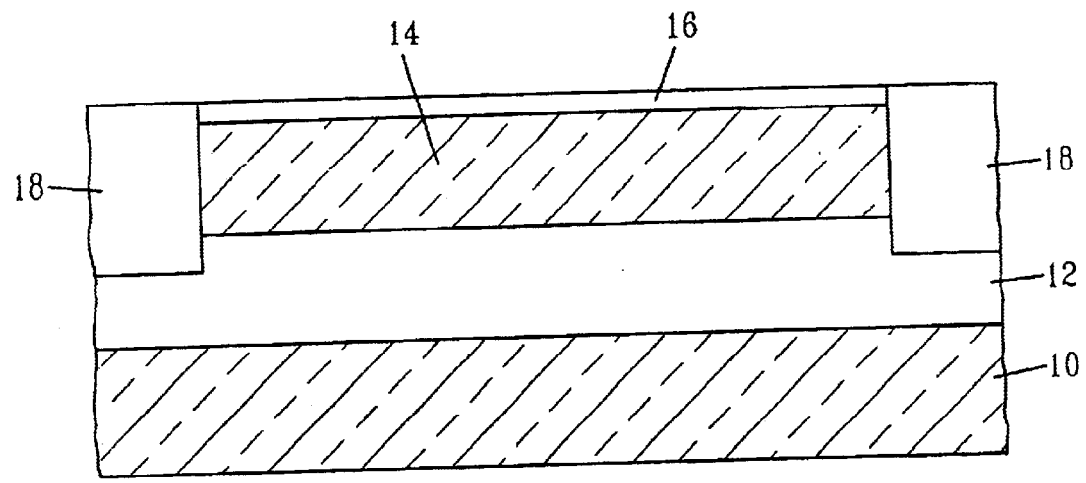

Next, a pad oxide layer (labeled as element 16 in FIG. 2) is formed atop SOI layer 14 by a conventional thermal oxidation process. Alternatively, pad oxide layer 16 may be formed by a deposition process, such as chemical vapor deposition (CVD), plasma-assisted CVD, evaporation, or chemical solution deposition. Pad oxide layer 16 formed at this point of the inventive process is a thin oxide layer having a thickness of from about 5 to about 20 nm.

Trench isolation regions 18 (See, FIG. 2) are then formed in the SOI structure by utilizing lithography and etching. The lithographic step employed in the present invention includes applying a photoresist (not shown) to a surface of pad oxide 16; exposing the photoresist to a pattern of radiation (in the present case a trench pattern is formed), and developing the pattern into the photoresist by utilizing a conventional resist developer. The etching step, which is used to transfer the trench pattern into the pad oxide layer and the SOI structure, includes any conventional dry etching process such as reactive-ion etching, ion beam etching, plasma etching, laser ablation or any combination thereof. A single etching process may be employed, or alternatively, more than one etching process may be employed to form trenches in the SOI structure.

After trenches have been formed in the SOI structure, the trenches are filled with a trench dielectric material such as a high-density plasma oxide or TEOS (tetraethylorthosilicate) using conventional deposition processes well known to those skilled in the art. In some embodiments of the present invention, the walls of the trenches are lined with a liner material, such as $SiO_2$ or $Si_3N_4$, prior to filling of the trench with a trench dielectric material. After the filling process, a conventional planarization process and/or densification process may be performed on the structure.

Figure 3:
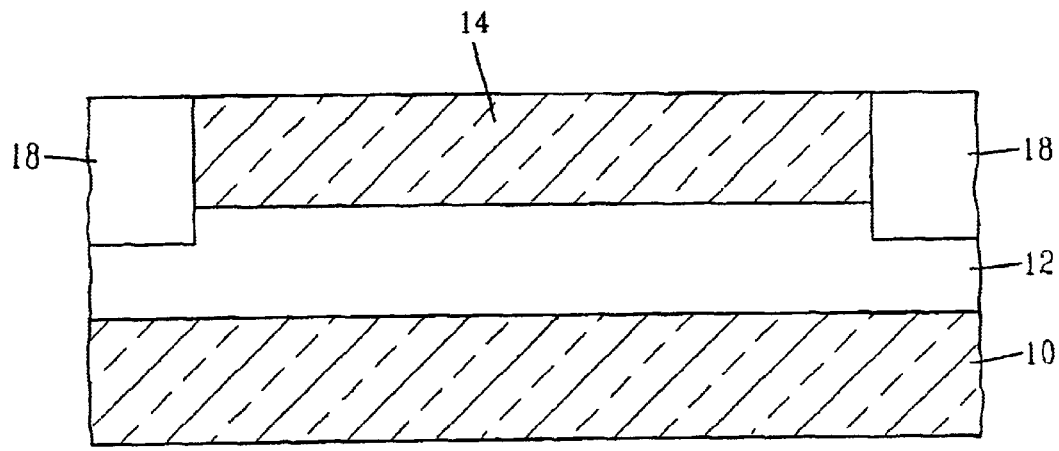

Next, and as illustrated in FIG. 3, pad oxide layer 16 is removed from the surface of SOI layer 14 using a stripping process that is highly selective in removing oxide and thereafter the exposed portions of the SOI layer are subjected to implantation and annealing using conditions that are well known to those skilled in the art so as to form well regions (not specifically shown) in the exposed portions of the SOI layer. For example, the well regions may be formed by ion implanting a p-type dopant into the SOI layer using an ion dosage of about 1E12 to about 1E13 atoms/cm$^3$ and the annealing may be carried out at 1000° C., for 5 seconds in Ar.

Figure 4:
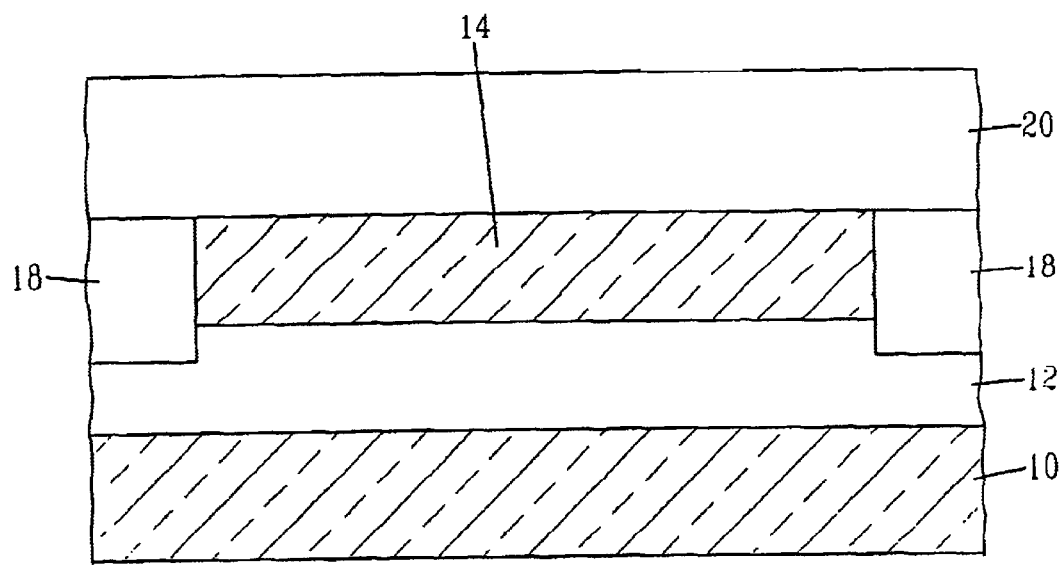

Sacrificial oxide layer 20 (See FIG. 4) is formed on the SOI layer utilizing a conventional deposition process such as CVD, plasma-assisted CVD, evaporation or chemical solution deposition. Note that during the etching process upper portions of the trench isolation regions are removed such that the trench isolation regions are coplanar with SOI layer 14. Sacrificial oxide layer 20 which may be comprised of TEOS or a high-density plasma oxide has a thickness of from about 50 to about 200 nm, with a thickness of from about 100 to about 150 nm being highly preferred.

Figure 5:
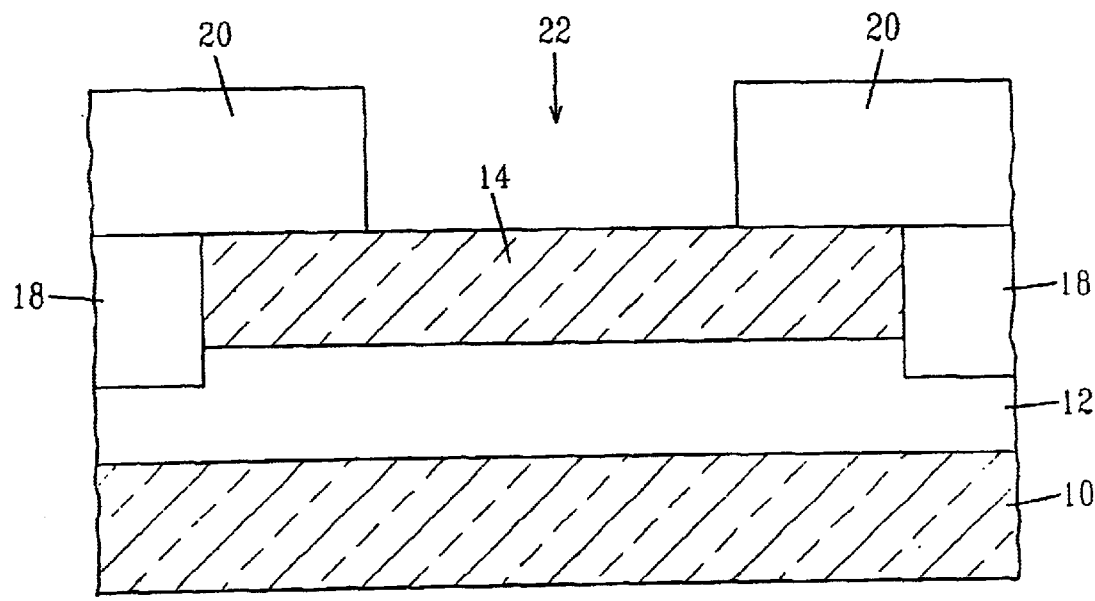

After formation of sacrificial oxide layer 20, a plurality of openings 22 (one of which is shown in FIG. 5) is formed in the sacrificial oxide layer using lithography and etching.

The etching step employed at this point of the present invention exposes portions of the underlying SOI layer. The exposed portions of the SOI layer represent the area whereat the recessed device channel of the CMOS device will be fabricated. It is noted that although the drawings of the instant application illustrate a single opening, the inventive method works equally well when a plurality of openings are formed in the sacrificial oxide layer.

The structure shown in FIG. 5 may also be formed using a replacement gate process. In such a process, a dummy gate (not shown) is first applied and patterned on portions of the SOI layer. TEOS or another like sacrificial oxide is then deposited and planarized to an upper surface of the dummy gate by chemical-mechanical polishing (CMP). After oxide formation, the dummy gate is removed providing the structure shown in FIG. 5. The replacement gate process is preferred in instances where small feature sizes are desired.

Figure 6:
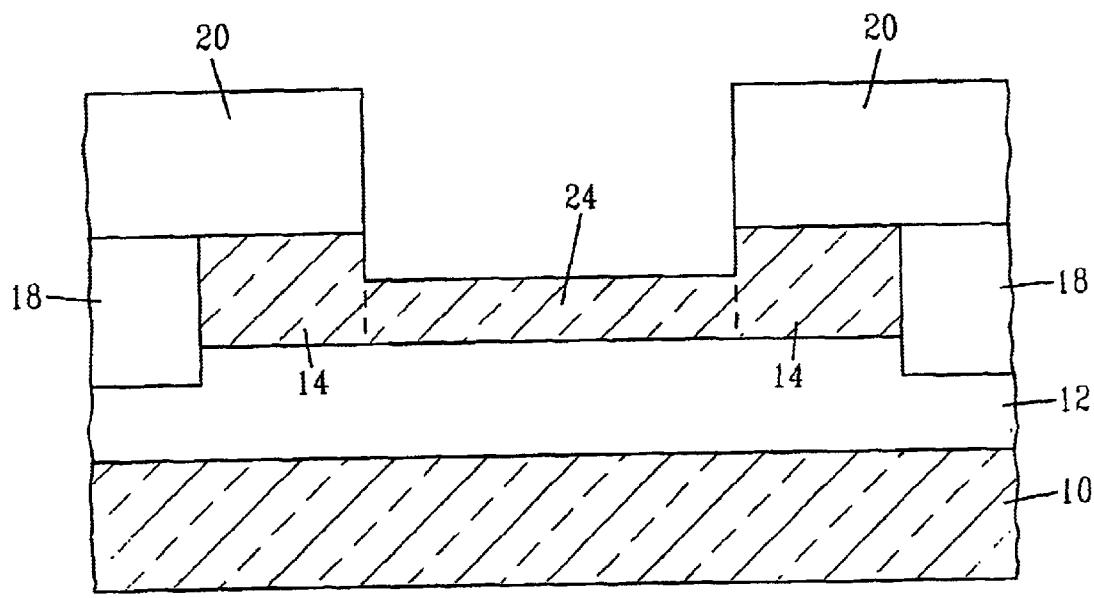

After forming the openings, the exposed portions of SOI layer 14 is then thinned to a thickness that is less than the thickness of the abutting SOI layer. Typically, the exposed SOI layer is thinned to a thickness of from about 5 to about 20 nm at this point of the inventive process. The resultant structure including thinned device channel, i.e., the recessed channel region, 24 is illustrated in FIG. 6. The thinning of the device channel may be performed using chemical downstream etching, reactive-ion etching or a combination of thermal oxidation and etching. The latter technique may be repeated any number of times. When thinning is achieved by thermal oxide and etching, the etching step may include a chemical oxide removal (COR) process that is carried out at relatively low pressures (6 millitorr or less) in a vapor of HF and $NH_3$.

Figure 7:
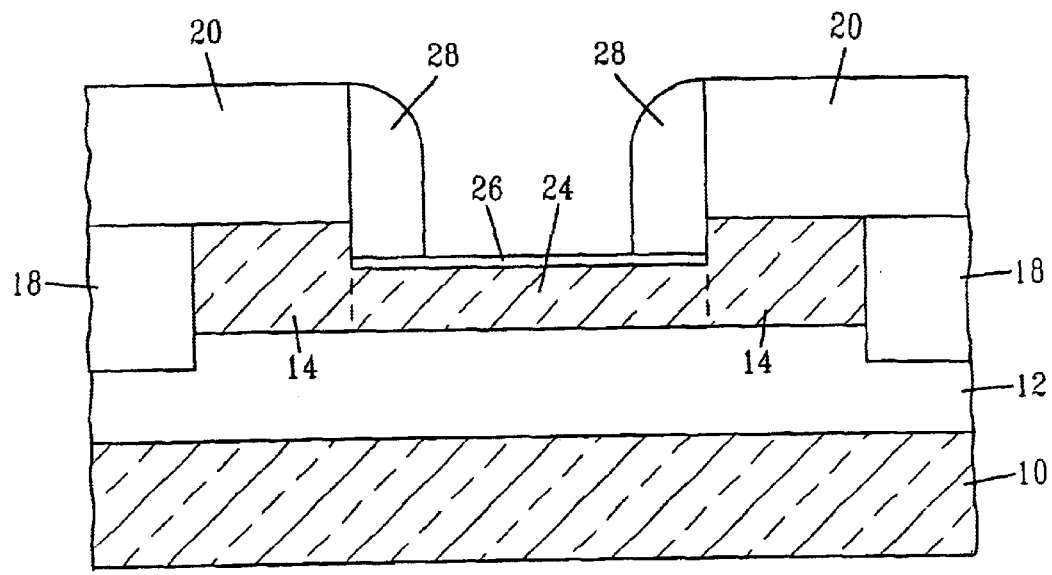

Next, gate dielectric 26 and sacrificial nitride spacers 28 are formed atop the thinned device channel providing the structure shown, for example, in FIG. 7. Gate dielectric 26 is formed atop the thinned device channel region utilizing a conventional deposition process. Alternatively, gate dielectric 26 may be formed by a thermal oxidation, nitridation or oxynitridation process. Combinations of the aforementioned processes may also be used in forming the gate dielectric. The gate dielectric 26 may be composed of any conventional dielectric including, but not limited to: $SiO_2$, $Si_3N_4$, $SiON$, $TiO_2$, $Al_2O_3$, $ZrO_2$, $HfO_2$, $Ta_2O_5$, and $La_2O_3$. Gate dielectric 26 may also comprise any combination of the aforementioned dielectric materials.

After gate dielectric 26 has been formed, sacrificial nitride spacers 28 are formed atop gate dielectric 26 so as to cover the exposed vertical walls of sacrificial oxide layer 20 as well as the exposed vertical sidewalls of the thicker SOI portion. Sacrificial nitride spacers 28, which are formed by deposition and etching, may also be referred to as reversed disposable nitride spacers since the spacers are formed prior to the formation of the gate inside the gate opening and are removed after source/drain implantation and annealing. In a normal process flow, the spacers are formed after the gate conductor outside the gate opening and they remain in the structure throughout the entire process.

Figure 8:
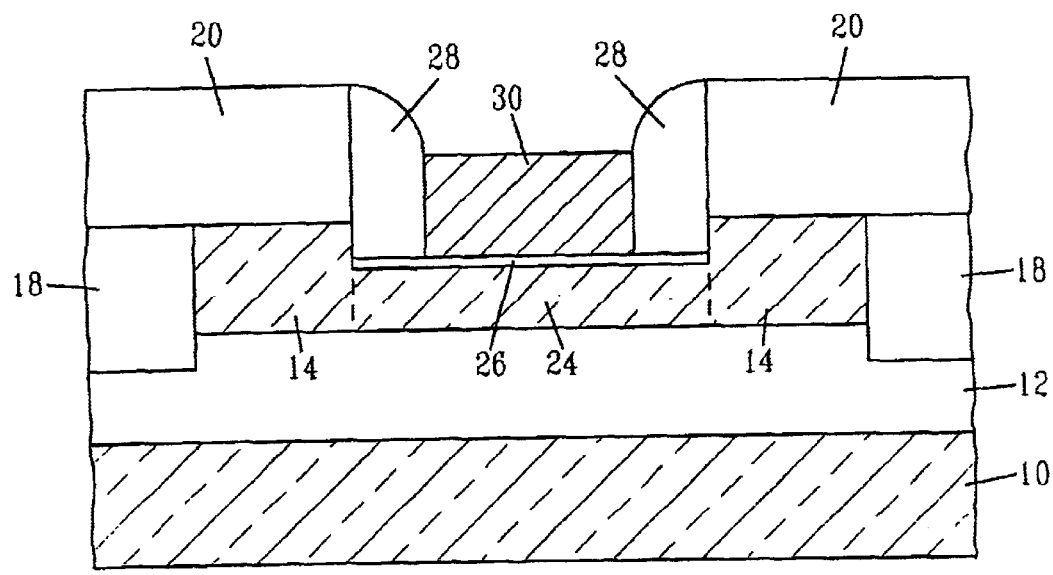

Gate conductor 30 is formed atop gate dielectric 26 by a conventional deposition process (such as CVD, plasma-assisted CVD, plating, sputtering and etc.) followed by planarization and recessing. Gate conductor 30 may comprise any conductive material including, but not limited to: polysilicon; a conductive elemental metal such as W, Cu, Pt, Ag, Au, Ru, Ir, Rh, and Re; alloys that include at least one of the aforementioned conductive elemental metals; silicide or nitrides that include at least one of the above-mentioned conductive elemental metals; and combinations thereof. When a combination of conductive materials is employed, an optional diffusion barrier material such as TaN or WN may be formed between the conductive materials. The resultant structure that is formed after gate conductor 30 has been formed is shown, for example, in FIG. 8.

A highly preferred conductive material employed as gate conductor 30 is polysilicon.

When a polysilicon gate conductor is employed, the polysilicon gate conductor is formed by deposition, planarization, ion implantation and annealing. The annealing conditions used at this point of the present invention in forming the polySi gate conductor may vary. Exemplary annealing conditions that may be employed in the present invention include: 1000° C. for 5 seconds.

Figure 9:
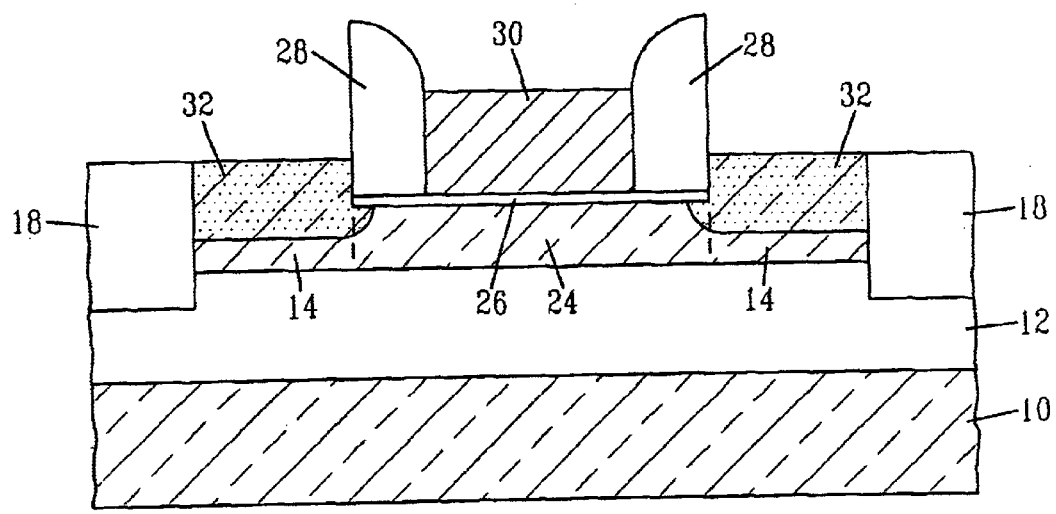

Reference is now made to the structure shown in FIG. 9 which is formed after the following processing steps have been carried out: First, sacrificial oxide layer 20 is removed from the structure using an etching process that is highly selective in removing oxide. Note that SOI layer 14 abutting the thinned device channel region is exposed after this step of the present invention. Source/drain regions 32 are then formed into the abutting SOI layer that is thicker than the recessed channel region by utilizing a conventional ion implantation process, followed by annealing. Because of the presence of the sacrificial nitride spacers during source/drain implantation and annealing, the source/drain regions do not substantially encroach upon the recessed device channel region.

Figure 10:
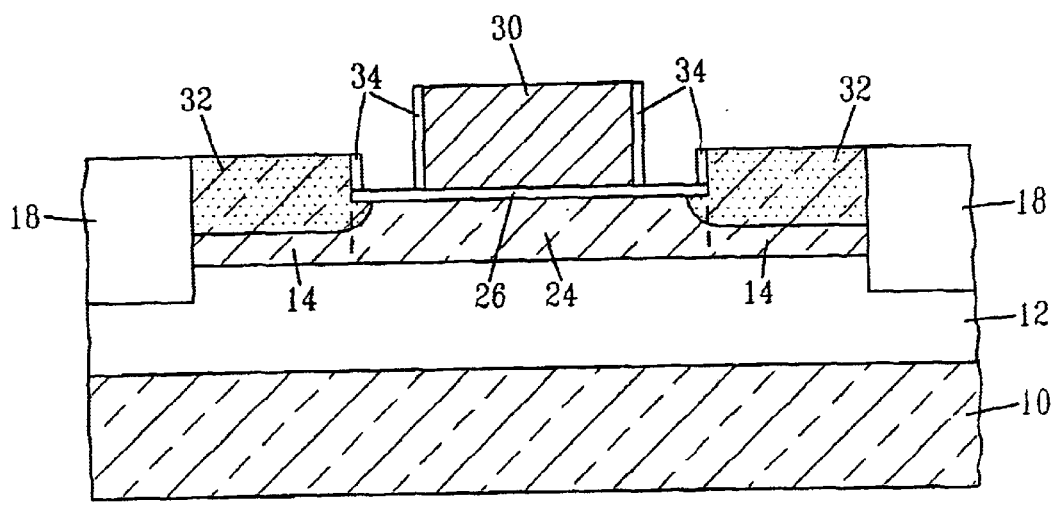

At this point of the present invention, sacrificial nitride spacers 28 are removed from the structure utilizing a conventional etching process that is highly selective in removing the nitride spacers providing the structure shown in FIG. 10. Following the removal of sacrificial nitride spacers 28 from the structure, thin oxide layer 34 is formed on the exposed vertical sidewalls of SOI layer 14 and gate conductor 30 utilizing a conventional oxidation process. The thin oxide layer formed at this point of the inventive process typically has a thickness of from about 3 to about 6 nm.

Next, extension implant regions and, optionally, halo implant regions are formed into the structure utilizing conventional ion implanting and annealing. Note that the extension implant regions, and optionally, the halo implant regions are implanted through the small opening that is near the gate edges. In accordance with the inventive method, the extension implants and, optionally, the halo implants may be performed using low implantation energies, on the order of about 5 keV or less for the extensions, 10 keV or less for n-halo and 70 keV or less for p-halo, and the activation annealing may also be carried out at relatively low thermal budgets, such as with spike anneals. In some embodiments of the present invention, a slight angled implant of about 10° or less may be used in forming the extension implant regions and 30° or less for the optional halo implant regions.

Figure 11:
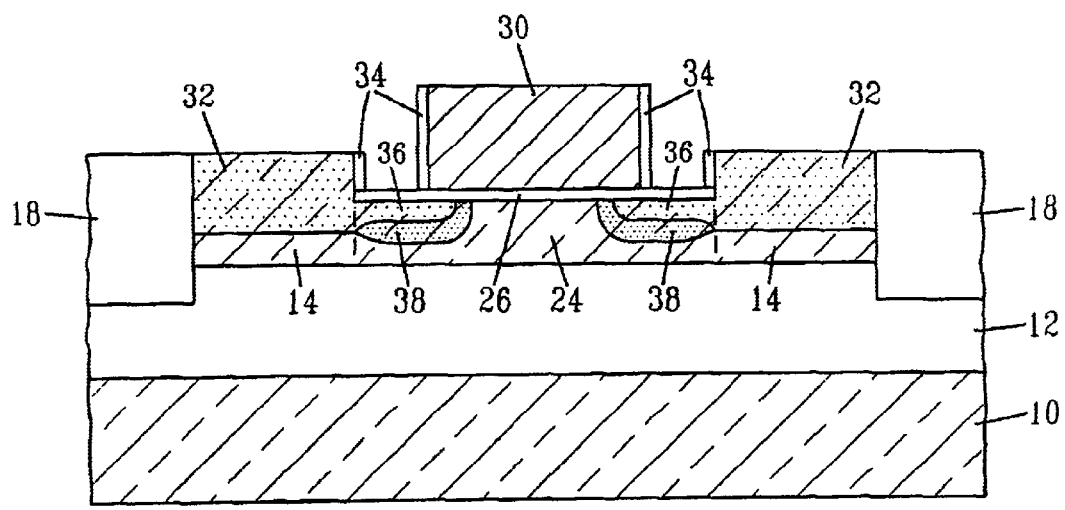

FIG. 11 shows the resultant structure that is formed after thin oxide layer 34 and the extension implant regions (and optionally, the halo implant regions) are formed. In this drawing, reference numeral 36 denotes the extension implant regions and reference numeral 38 denotes the optional halo implant regions.

Figure 12:
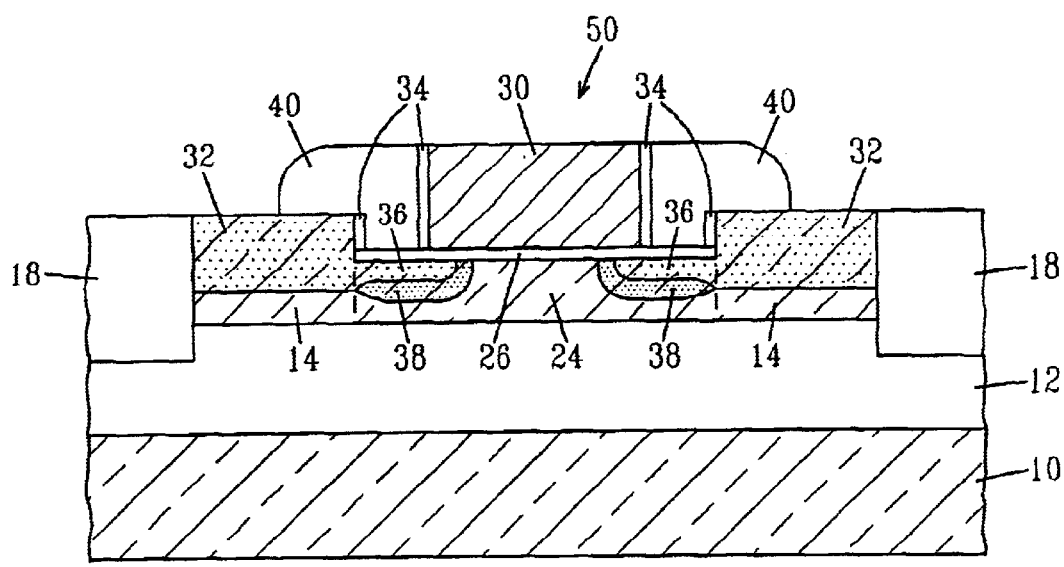

FIG. 12 shows the structure that is formed after permanent spacer 40 is formed atop the SOI layer. The permanent spacers, which may be composed of an oxide, nitride, oxynitride or any combination thereof, are formed by deposition and etching.

Next, raised source/drain regions (not shown) may be optionally formed atop the surface of the source/drain regions by epitaxially growing an epi Si layer thereon. To either the raised source/drain regions or to the previously formed source/drain regions, salicide regions (not shown) may be formed using a conventional salicidation process that includes, for example, forming a refractory metal such as Ti, Co or Ni on Si surfaces; heating the structure to form silicide regions; and thereafter removing any non-reactive metal that was not silicided during the heating process. Note that when the gate conductor is polysilicon, a salicide region is formed in the upper exposed portion of the polysilicon gate conductor unless appropriate steps (such as block mask formation) are taken to prevent the formation of a salicide region in the polysilicon gate conductor.

The structure shown in FIG. 12 includes an SOI structure that comprises bottom Si-containing layer 10, insulating layer 12 present atop Si-containing layer 10, and SOI layer 14 which includes a recessed channel region 24 and abutting thicker source/drain regions 32. Gate region 50 which is comprised of at least gate dielectric 26 and gate conductor 30 is present atop at least a portion of thinned device channel region (i.e., recessed channel region 24). The structure shown in FIG. 12 also includes extension implant regions 36 that have an abrupt lateral profile. The structure may also include halo regions that are laterally abrupt. As shown, the extension implant regions overlap the gate region of the inventive recessed channel CMOS structure.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the spirit and scope of the appended claims.

Having thus described our invention in detail, what we claim as new and desire to secure by the letters patent is:

1. A recessed channel CMOS device comprising:
   an SOI layer having a recessed channel region and adjoining extension implant regions; and
   at least one gate region present atop said SOI layer, wherein said adjoining extension implant regions have an abrupt lateral profile and are located beneath said gate region, said abrupt lateral profile having a lateral drop of about one decade in implant concentration in less than about 150 Å.

2. The recessed channel CMOS of claim 1 wherein said SOI layer is part of an SOI structure.

3. The recessed channel CMOS of claim 1 wherein said recessed channel region has a thickness of from about 5 to about 20 nm.

4. The recessed channel CMOS of claim 1 wherein said SOI layer further comprises source/drain regions.

5. The recessed channel CMOS of claim 1 wherein said gate region comprises a gate dielectric and a gate conductor.

6. The recessed channel CMOS of claim 5 wherein said gate dielectric comprises $SiO_2$, $Si_3N_4$, SiON, $TiO_2$, $Al_2O_3$, $ZrO_2$, $Ta_2O_5$, $La_2O_5$ or any combination thereof.

7. The recessed channel CMOS of claim 5 wherein said gate conductor comprises polysilicon, an elemental conductive metal, an alloy that includes at least an elemental conductive metal, a silicide of an elemental conductive metal, a nitride of an elemental conductive metal or any combination thereof.

8. The recessed channel CMOS of claim 1 further comprising halo implant regions that have an abrupt lateral profile which are located beneath said gate region.

9. The recessed channel CMOS of claim 1 further comprising permanent spacers present on exposed sidewalls of said gate region.

* * * * *